United States Patent [19]
Hamasaki et al.

[11] Patent Number: 5,976,269
[45] Date of Patent: Nov. 2, 1999

[54] PRINTING MASK CLEANING APPARATUS AND METHOD

[75] Inventors: Kurayasu Hamasaki, Katano; Toshiaki Yamauchi, Yawata; Kazue Okanoue, Tokushima-ken; Kazumi Ishimoto, Katano; Ken Takahashi; Takao Naito, both of Yamanashi-ken; Koji Mitsushiro, Enzan, all of Japan

[73] Assignee: Matsushita Electric Industrial Co., Ltd., Osaka-fu, Japan

[21] Appl. No.: 08/942,111

[22] Filed: Oct. 1, 1997

[30] Foreign Application Priority Data

Oct. 2, 1996 [JP] Japan .................................. 8-261660

[51] Int. Cl.⁶ .................................................. B41F 35/00
[52] U.S. Cl. .............................. 134/21; 15/308; 15/309.2; 101/423; 101/425
[58] Field of Search .................................. 15/308, 309.1, 15/309.2, 306.1; 134/21; 101/423, 424, 425

[56] References Cited

U.S. PATENT DOCUMENTS

| | | | |
|---|---|---|---|
| 5,197,384 | 3/1993 | Yawata et al. | 101/123 |
| 5,206,970 | 5/1993 | Johnson | 101/425 |
| 5,309,837 | 5/1994 | Nanzai | 101/425 |
| 5,491,871 | 2/1996 | Reber et al. | 15/308 |

FOREIGN PATENT DOCUMENTS

| | | |
|---|---|---|
| 0 642 923 | 3/1995 | European Pat. Off. . |
| 0 680 247 | 11/1995 | European Pat. Off. . |
| 2 297 947 | 8/1996 | United Kingdom . |

*Primary Examiner*—Robert J. Warden, Sr.
*Assistant Examiner*—Theresa T. Snider
*Attorney, Agent, or Firm*—Wenderoth, Lind & Ponack, L.L.P.

[57] ABSTRACT

A main wiping portion which contacts the back of a mask through a cleaning paper is provided behind a suction port as viewed in the direction of movement of an air suction portion. The cleaning paper is able to wipe off both solder paste adhered on the back of the mask and solder paste discharged from openings of the mask by suction through the suction port, whereby the solder paste deposits on the mask can be cleaned off at high removal efficiency.

18 Claims, 13 Drawing Sheets

Fig./9A (PRIOR ART)
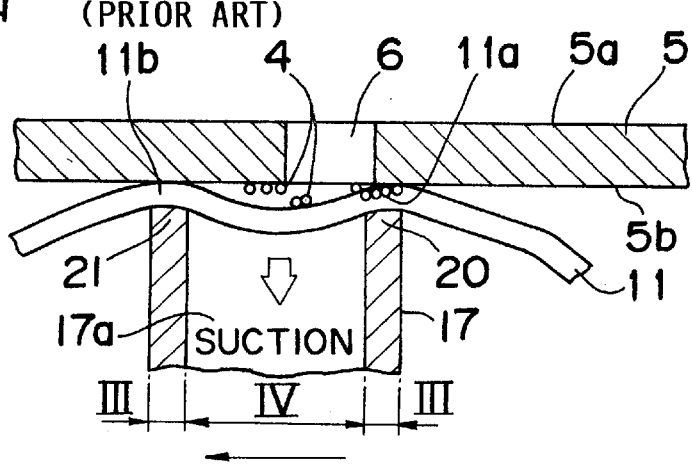
Fig./9B (PRIOR ART)
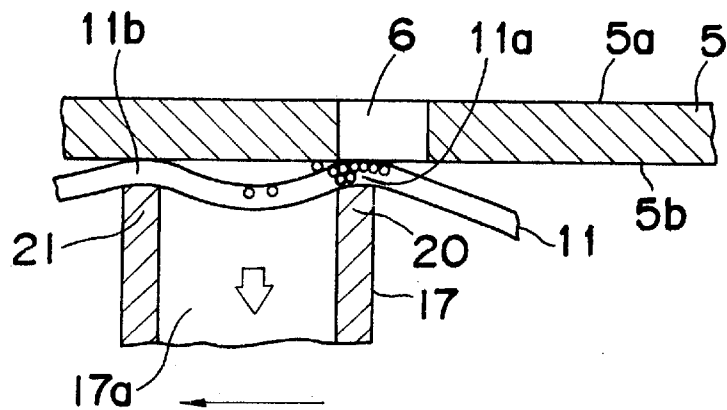
Fig./9C (PRIOR ART)
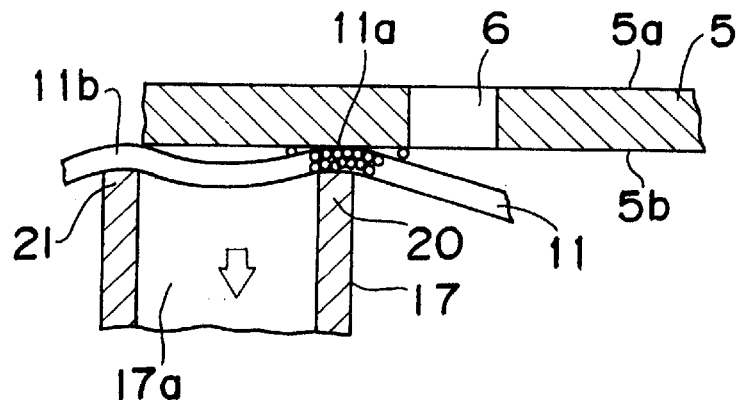

PRINTING MASK CLEANING APPARATUS AND METHOD

BACKGROUND OF THE INVENTION

The present invention relates to an apparatus and method for cleaning a printing mask used in printing and coating various kinds of printing material, for example, solder paste, conductor paste, or insulator paste, on a surface to be printed.

Hitherto, in the fabrication of electronic circuit boards, it has been general practice to use solder paste for soldering electronic components, such as chip components, to a printed board. A solder paste printer has been used for printing and coating solder paste in a desired pattern.

Conventionally, solder paste printing has been carried out using such a method and apparatus as described below. In FIGS. 15 and 16, numeral 1 designates a printed board, 2 a land on which solder paste 4 is to be printed, 3 a solder resist, 5 a metallic mask formed with openings 6 of such a pattern as to enable the solder paste 4 to be printed on the land 2 as desired, and 7 a printing squeegee which is linearly movable on the surface 5a of the mask 5. Printing the solder paste 4 on the printed board 1 is carried out by positioning the mask 5 on the printed board 1 in superposed relation therewith, moving the squeegee 7 linearly as it is held in contact with the mask 5 under a proper printing pressure, thereby allowing the solder paste 4 coated on the mask 5 to be filled in the openings 6 of the mask 5, and then printing and coating the solder paste 4 on the printed board 1 through the mask 5, with the mask 5 spaced from the printed board 1.

When such solder paste printing is carried out successively, as FIG. 16 shows, solder paste 4 is adhered/deposited onto the back 5b of the mask 5. Usually, therefore, the printer is equipped with a cleaner 9 as shown in FIG. 17 so that the solder paste 4 adhered onto the back 5b of the mask 5 can be removed. In that figure, numeral 10 designates a cleaning squeegee, 11 a cleaning paper, 12 a cleaning paper feeder, and 13 a cleaning paper take-up. Shown by 8 is a mask frame.

Operation of such a cleaner 9 for removal of solder paste 4 is carried out in the following way. First, the cleaner 9 is moved in its entirety to a position I and the cleaning squeegee 10 is elevated until it goes into contact with the back 5b of the mask 5 through the cleaning paper 11. While being kept in that condition, the cleaner 9 is moved toward a position II. When the cleaner 9 has been moved to the position II, the cleaning squeegee 10 is lowered, then the cleaning paper take-up 13 is caused to take up the cleaning paper 11 which has performed cleaning, and accordingly fresh cleaning paper 11 is supplied from the cleaning paper feeder 12. Subsequently, the cleaning squeegee 10 is elevated again and the cleaner 9 is moved from the position II and toward the position I in the same way as above described. When the cleaner 9 has moved to the position I, the cleaning squeegee is lowered and the cleaner 9 is brought back to its initial position, whereupon the solder removing operation ends.

Recently, there has been proposed a cleaner 30 which includes, in addition to the above described arrangement of cleaner 9, cleaning means having an air jet portion 15 connected to an air jet mechanism 14, and an air suction portion 17 connected to an air suction mechanism 16, as illustrated in FIG. 18. Shown by 18 is a filter provided in the air suction portion 17.

In a cleaning operation using such a cleaner 30, the air jet portion 15 and the air suction portion 17 are moved to the position I, then the air jet portion 15 is lowered and the air suction portion 17 is elevated so that their respective front ends are brought into contact with the mask 5 at contact portions 20 and 21. The contact portions 20, 21 of the air suction portion 17 contact the back 5b of the mask 5 through the cleaning paper 11 to prevent any air inflow through the contact portions into a suction port 17a and to permit air to be sucked into the suction port 17a only through the openings 6 of the mask 5. With this condition maintained as such, the air jet portion 15 and the air suction portion 17 are synchronously moved toward the position II along the mask 5 to thereby remove solder paste 4 adhered within the openings 6 and on the back 5b of the mask 5. That is, the air suction portion 17 connected to the air suction mechanism 16 is brought into contact with the back 5b of the mask 5 through the cleaning paper 11, and the air jet portion 15 is brought into contact with the surface 5a of the mask 5 in corresponding relation to the air suction portion 17. With air jetting from the air jet portion 15 and with air suction by the air suction portion 17, solder paste 4 adhered within and around the openings 6 of the mask 5 is scattered and/or caused to flow toward the back 5b of the mask 5. Thus, scattered fragments of solder paste 4 are collected onto the cleaning paper 11 and outflow fragments of solder paste 4 adhered onto the back 5b are collected onto the cleaning paper 11 at the contact portion 20 when the cleaner 30 moves from the position I to the position II. After the removal of fragments of solder paste 4 adhered in the openings 6 has been completed in this way, the air jet from the air jet mechanism 14 and air suction by the air suction mechanism 16 are stopped. Then, the air jet portion 15 is elevated, and the air suction portion 17 is lowered. Thereafter, the cleaner is made to return to its initial condition, its cleaning operation being thus ended.

Such a cleaning method including the steps of air jetting and air suction has an advantage over the cleaning method illustrated in FIG. 17 in that solder paste 4 adhered within the openings 6 of the mask 5 and onto the inner periphery thereof can be removed, it being thus possible to improve removal efficiency with respect to solder paste 4.

In the above described cleaner 30, however, the contact portions 20, 21 of air suction portion 17 which contact the back 5b of the mask 5 are merely intended to define a suction port 17a to permit air suction into the suction port 17a only through the openings 6 as stated above. As such, in the prior art there has been no technical concept that the back 5b of the mask 5 be positively cleaned by means of the contact portions 20, 21. As FIG. 19A shows, therefore, the span III of the contact portions 20, 21 each as viewed in the direction of movement of the cleaner 30 is designed to be not more than 1 mm. In the cleaner 30, the span IV of the suction port 17a as viewed in the direction of movement of the cleaner 30 is 3 mm. In FIGS. 19A, 19B, and 19C, the air jet portion 15 is not shown.

In the cleaner 30 of the prior art construction, therefore, the areas of the contact portions 20, 21 which go into contact with the mask 5 are small. Thus, as FIGS. 19A to 19C show, along with the movement of the air suction portion 17 from the position I toward the position II, the surface of those portions 11a, 11b of the cleaning paper 11 which are held between the back 5b of the mask 5 and the contact portions 20, 21, and adjacent portions thereof will be readily covered with a mass of solder paste 4. With the cleaning paper 11 so covered with solder paste 4, it is impossible to collect the mass of solder paste 4 adhered on the back 5b of the mask 5, with the result that some solder paste 4 remains in the openings 6 and on the back 5b of the mask 5 even after the end of the cleaning operation. This poses a disadvantage that in a subsequent printing process there might occur such printing defects as earlier mentioned, including poor off-plate effects and solder ball bridges. In FIGS. 19A–19C, solder paste 4 is more precisely illustrated, with spherical solder particles contained therein being shown on an enlarged scale.

SUMMARY OF THE INVENTION

The present invention is directed to solving such a disadvantage and accordingly it is an object of the invention to provide a cleaning apparatus and method which capable of cleaning printing material, such as solder paste, at high removal efficiency over an overall cleaning work range from a cleaning start position to a cleaning end position.

In accomplishing these and other aspects, according to a first aspect of the present invention, there is provided a printing mask cleaning apparatus for cleaning a printing mask formed with openings of a predetermined pattern after a printing operation has been carried out to course printing material to be printed through the openings on a surface to be printed.

The printing mask cleaning apparatus comprises:

a suction portion movable during a cleaning operation while in contact through a cleaning sheet with a back of the printing mask which contacts the surface to be printed, the suction portion having a suction port which is open in opposed relation to the back of the printing mask, the suction portion extending in a direction orthogonal to a direction of movement thereof;

a vacuum device for sucking gas through the openings and the suction port of the suction portion, with the suction portion held in contact with the back of the printing mask through the cleaning sheet, so that a printing material adhered within the openings of the printing mask can be discharged toward the back; and a main wiping portion disposed behind an aperture of the suction port as viewed in the direction of movement of the suction portion, and movable in the direction of movement of the suction portion while in pressure contact with the back of the printing mask during the cleaning operation for wiping onto the cleaning sheet printing material adhered on the back of the printing mask and a printing material mass discharged from the openings through suction.

According to a second aspect of the present invention, there is provided a printing mask cleaning apparatus as set forth in the first aspect, wherein a span of the main wiping portion as measured in the direction of movement of the apparatus is not less than 5 mm.

According to a third aspect of the present invention, there is provided a printing mask cleaning apparatus as set forth in the first or second aspect, wherein the main wiping portion is formed integrally with the suction portion.

According to a fourth aspect of the present invention, there is provided a printing mask cleaning apparatus as set forth in any one of the first to third aspects, and further comprising a subsidiary wiping portion disposed ahead of the aperture of the suction port as viewed in the direction of movement of the suction portion, and movable in the direction of movement of the suction portion while in pressure contact with the back of the printing mask during the cleaning operation for wiping onto the cleaning sheet a printing material adhered on the back of the printing mask.

According to a 5th aspect of the present invention, there is provided a printing mask cleaning apparatus as set forth in the fourth aspect, wherein a span of the main wiping portion as viewed in the direction of movement of the suction portion is larger than that of the subsidiary wiping portion.

According to a 6th aspect of the present invention, there is provided a printing mask cleaning apparatus as set forth in the 4th or 5th aspect, wherein a combined span of the main wiping portion and the subsidiary wiping portion as viewed in the direction of movement of the suction portion is not less than 5 mm.

According to a 7 th aspect of the present invention, there is provided a printing mask cleaning apparatus as set forth in any one of the 4th to 6th aspects, wherein the main wiping portion and the subsidiary wiping portion are formed integrally with the suction portion.

According to an 8th aspect of the present invention, there is provided a printing mask cleaning apparatus as set forth in any one of the 1st to 7 th aspects, wherein an aperture area of the suction port of the suction portion is an area such that a product of a flow rate of gas passing through the suction port under suction as multiplied by a flow velocity of the gas is maximized.

According to a 9th aspect of the present invention, there is provided a printing mask cleaning apparatus as set forth in any one of the 1st to 8th aspects, wherein the suction portion includes a plurality of suction ports arranged in the direction of movement of the suction portion, and wiping portions provided behind and before an aperture of each respective suction port as viewed in the direction of movement of the suction portion.

According to a 10th aspect of the present invention, there is provided a printing mask cleaning apparatus as set forth in any one of the 1st to 9th aspects, wherein suction ports of the suction portion are arranged in staggered relation along a length of the suction portion, and wherein wiping portions are provided behind and before an aperture of each respective suction port as viewed in the direction of movement of the suction portion.

According to an 11th aspect of the present invention, there is provided a printing mask cleaning apparatus as set forth in any one of the 1st to 10th aspects, wherein a surface of the suction portion which contacts the back of the printing mask through the cleaning sheet is curved in a convex fashion along a length of the suction portion.

According to a 12th aspect of the present invention, there is provided a printing mask cleaning apparatus as set forth in any one of the 1st to 11th aspects, wherein the cleaning sheet is movable relative to the movement of the suction portion.

According to a 13th aspect of the present invention, there is provided a printing mask cleaning apparatus as set forth in any one of the 4th to 12th aspects, wherein for the purpose of reciprocal movement of the suction portion over the back of the printing mask, the main wiping portion and the subsidiary wiping portion are formed so as to have approximately the same length in the direction of movement of the suction portion, and wherein the subsidiary wiping portion performs approximately the same function as the main wiping portion which wipes onto the cleaning sheet printing material adhered on the back of the printing mask and a printing material mass discharged from the openings through suction.

According to a 14th aspect of the present invention, there is provided a printing mask cleaning method for cleaning a printing mask formed with openings of a predetermined pattern after a printing operation has been carried out using the printing mask in printing printing material through the openings on a surface to be printed, wherein a cleaning operation is carried out using a printing mask cleaning apparatus which comprises:

a suction portion movable during a cleaning operation while in contact through a cleaning sheet with a back of the printing mask which contacts the surface to be printed, the suction portion having a suction port which is open in opposed relation to the back of the printing mask, the suction portion extending in a direction orthogonal to a direction of movement thereof; and a vacuum device for sucking gas through the openings and the suction port of the suction portion, with the suction portion held in contact with the back of the printing mask through the cleaning sheet, so that a printing material adhered within the openings of the printing mask can be discharged toward the back;

the method comprising:

after causing the printing material adhered within the openings of the printing mask to be discharged toward the back by suction, wiping onto the cleaning sheet printing material adhered onto the back of the printing mask and the adhered printing material discharged by suction from the openings by means of a main wiping portion disposed behind an aperture of the suction port as viewed in the direction of movement of the suction portion, and movable in the direction of movement of the suction portion while in pressure contact with the back of the printing mask during the cleaning operation.

According to a 15th aspect of the present invention, there is provided a printing mask cleaning method as set forth in the 14th aspect, wherein before the printing material adhered within the openings of the printing mask is discharged toward the back of the printing mask, the printing material adhered on the back is wiped onto the cleaning sheet by means of a subsidiary wiping portion disposed ahead of the aperture of the suction port as viewed in the direction of movement of the suction portion, and movable in the direction of movement of the suction portion while in pressure contact with the back of the printing mask during the cleaning operation.

According to a 16th aspect of the present invention, there is provided a printing mask cleaning method as set forth in the 15th aspect, wherein a span of the main wiping portion as viewed in the direction of movement of the suction portion is larger than a length of the subsidiary wiping portion as viewed in the direction of movement of the suction portion.

According to a 17th aspect of the present invention, there is provided a printing mask cleaning method as set forth in any one of the 14th to 16th aspects, wherein the suction portion includes a plurality of suction ports arranged in the direction of movement of the suction portion, and wiping portions provided behind and before an aperture of each respective suction port as viewed in the direction of movement of the suction portion.

According to an 18th aspect of the present invention, there is provided a printing mask cleaning method as set forth in any one of the 14th to 17th aspects, wherein suction ports of the suction portion are arranged in staggered relation along a length of the suction portion, and wherein wiping portions are provided behind and before an aperture of each respective suction port as viewed in the direction of movement of the suction portion.

BRIEF DESCRIPTION OF THE DRAWINGS

These and other aspects and features of the present invention will become clear from the following description taken in conjunction with the preferred embodiments thereof with reference to the accompanying drawings, in which:

FIG. 4;

FIGS. 19A, 19B, and 19C are views for explaining, in sequential order, the process of adhered solder paste being removed by the cleaning apparatus shown in FIG. 18.

DETAILED DESCRIPTION OF THE PREFERRED EMBODIMENTS

Figure 1:
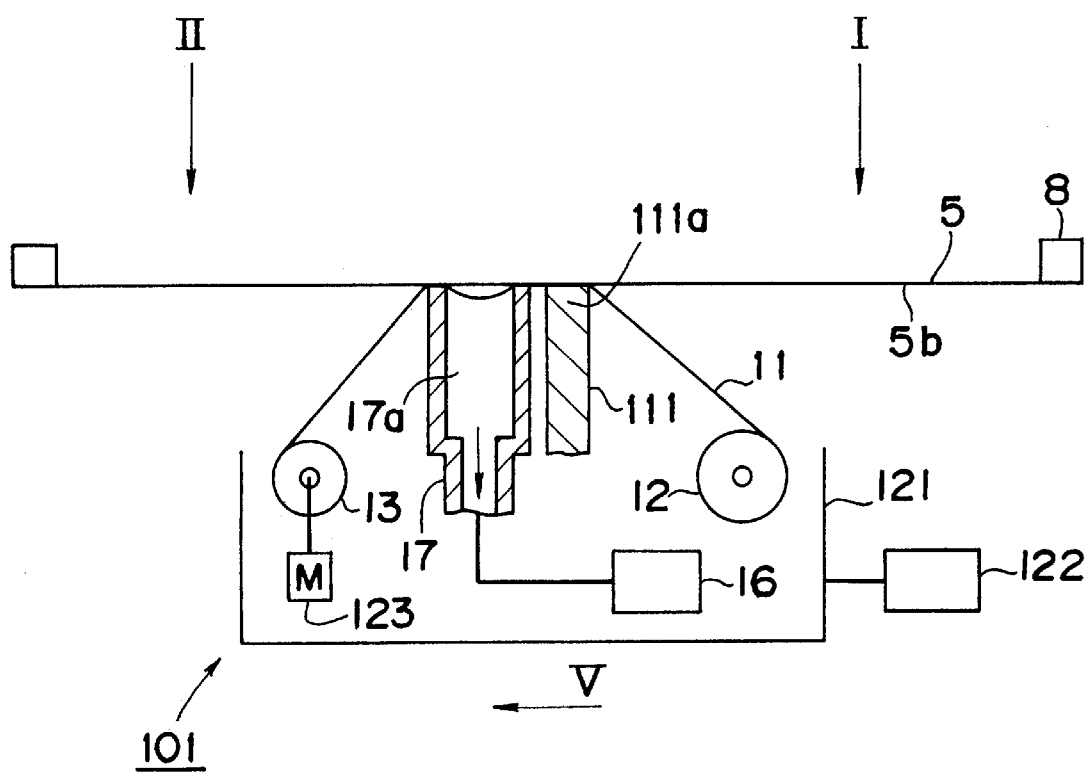
FIG. 1 is a view showing the arrangement of a cleaning apparatus representing a first embodiment of the present invention.

Before the description of the present invention proceeds, it is to be noted that like parts are designated by like reference numerals throughout the accompanying drawings.

A cleaning apparatus and method for cleaning a printing mask, as one embodiment of the present invention, will now be described with reference to the drawings. In the drawings, component parts which perform identical or similar functions are designated by like reference numerals. The cleaning method is carried out by the cleaning apparatus. In various embodiments, a printed board is used as a surface to be printed by way of example, but without limitation thereto. Similarly, as printing material is exemplified solder paste, but printing material is not limited thereto. Various other printing materials, such as conductor paste and insulator paste, are available for use as such.

The printing mask 5 used in each respective embodiment is made of stainless steel and has a thickness of 0.14 mm.

Each opening 6 formed in the mask 5 has an elongated slot shape with a width of 0.15 mm and a length of 1.4 mm. Solder particles contained in solder paste 4 have a particle size of 10 to 30 μm. Cleaning paper 11, as one example of a cleaning sheet, is a nonwoven cotton fabric having a thickness of 0.5 mm to 1 mm.

First Embodiment

As earlier stated, contact portions 20, 21 of the air suction portion 17 of the prior art cleaner 30 include no technical concept that the back 5b of the mask 5 be positively cleaned. In the cleaning apparatus 101 as a first embodiment, as FIG. 1 shows, a main wiping portion 111 for positively cleaning the back 5b of the mask 5 is provided, separately from the air suction portion 17, behind a suction port 17a of the air suction portion 17 as viewed in the direction of movement V of the cleaning apparatus 101.

The main wiping portion 111 is an elongate plate-like member extending along the length of the air suction portion 17 which extends in a direction orthogonal to the direction of movement V, and is made from the same material as the contact portions 20, 21 of the air suction portion 17. The main wiping portion 111 may be mounted on a movable carriage 121 which carries an air suction mechanism 16, an air suction portion 17, a cleaning paper feeder 12, a cleaning paper take-up 13, and the like. Therefore, during the process of cleaning the back 5b of the mask 5, a contact portion 111a of the main wiping portion 111 is pressed against the back 5b through the cleaning paper 11, and is moved along with the air suction portion 17 and the like in the direction of movement V as the movable carriage 121 is driven by a driving unit 122, or a motor, for example, to move in the direction of movement V.

Figure 13:
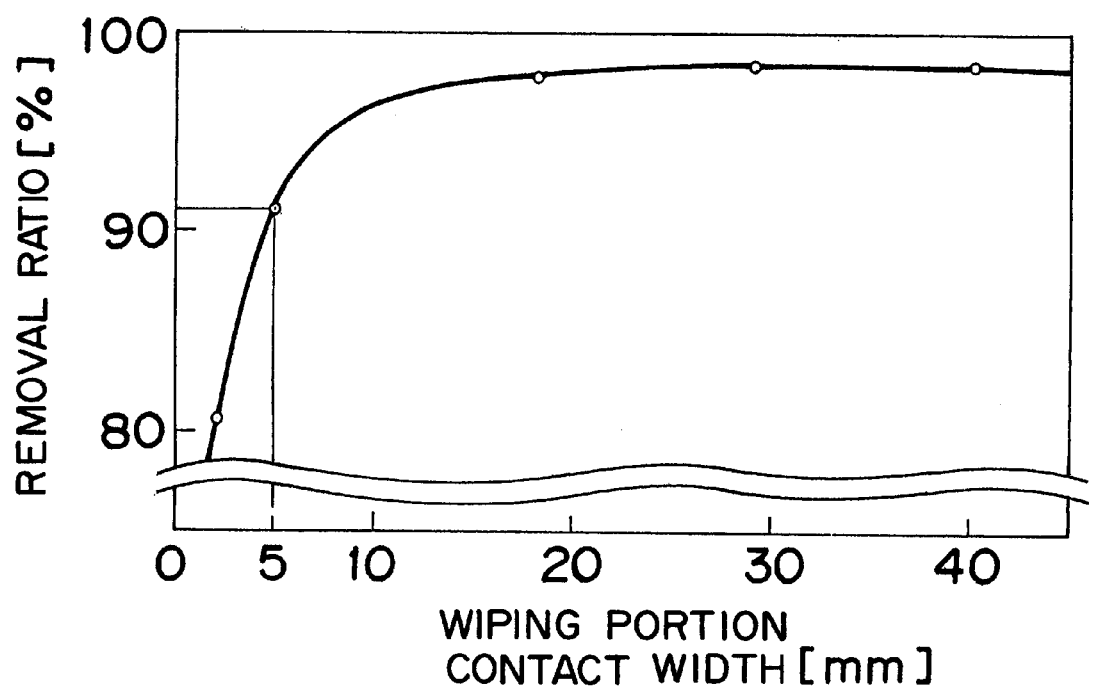
FIG. 13 is a graph showing the relationship between contact width of main and subsidiary wiping portions and removal efficiency.

As FIG. 13 illustrates, the span of the contact portion 11a of the main wiping portion 111 as viewed in the direction of movement V is not less than 5 mm where a removal efficiency of 90% or more is a target to attain in removing solder paste 4 by cleaning paper 11 from the back 5b of the mask 5. As may be apparent from FIG. 13, if the span is more than about 30 mm, little or no improvement in removal efficiency could be expected. Therefore, it is desirable that the span be up to about 40 mm maximum. With respect to removal efficiency measurements in FIG. 13, it is assumed that the main wiping portion 111 moves one way on the back 5b of the mask 5 from a position I (hereinafter referred to as "cleaning start position") to a position II (hereinafter referred to as "cleaning end position") while the air suction portion 17 is carrying out air suction.

In the cleaning apparatus 101 of the first embodiment, there is no provision of such an air jet portion 15 as employed in the prior art.

Operation of the cleaning apparatus 101 as the first embodiment will be described hereinbelow.

After solder paste printing is carried out on a printed board using the printing mask 5 in a desired pattern, the cleaning apparatus 101 in its entirety shifts to the cleaning start position I. The air suction portion 17 and main wiping portion 111 ascend toward the printing mask 5 and go into pressure contact with the back 5b of the mask 5 through the cleaning paper 11. Then, the air suction mechanism 16 begins air suction through the openings 6 of the mask 5. While this condition is maintained, the movable carriage 121 with the cleaning apparatus 101 mounted thereon is actuated by the drive unit 122 to move in the direction of movement V toward the cleaning end position II and to remove solder paste 4 adhered within the openings 6 and onto the back 5b of the mask 5.

Figure 2A:
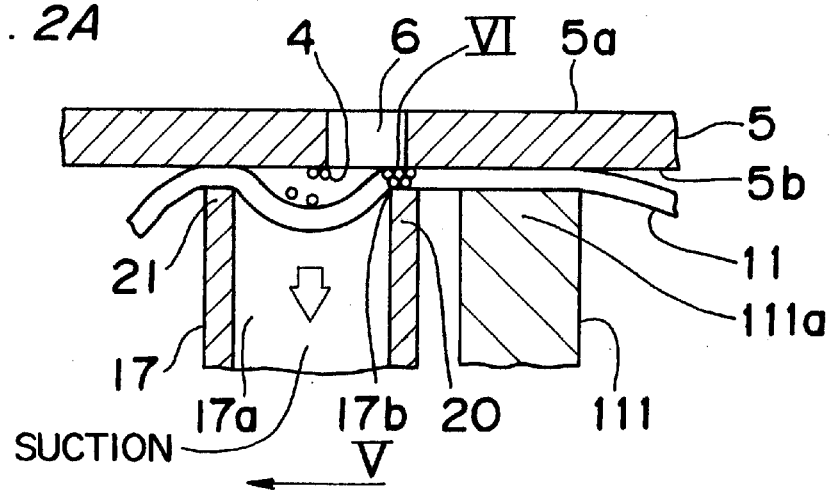
FIGS. 2A, 2B, and 2C are views for explaining, in sequential order, the process of adhered solder paste being removed by the cleaning apparatus shown in FIG. 1.
Figure 2B:
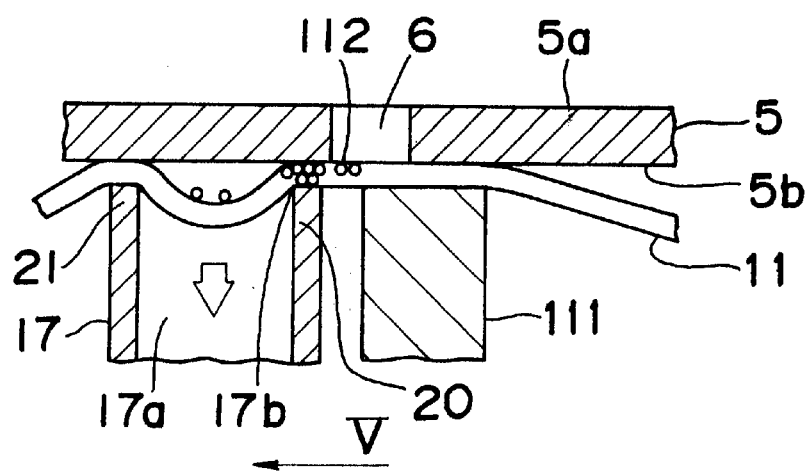

That is, as FIG. 2A shows, the solder paste 4 discharged from within the openings 6 of the mask 5 by the above mentioned air suction toward the back 5b of the mask 5, and the solder paste 4 adhered on the back 5b, will adhere to the portion VI of the cleaning paper 11 which is located between the contact portion 20 of the air suction portion 17 and the back 5b. However, as earlier mentioned, the span of the contact portion 20 as viewed in the direction of movement V is 1 mm and, therefore, the portion VI of the cleaning paper 11 is saturated with solder paste 4 with the result that, as FIG. 2B shows, there occurs some solder paste 112 residue left unwiped.

Figure 2C:
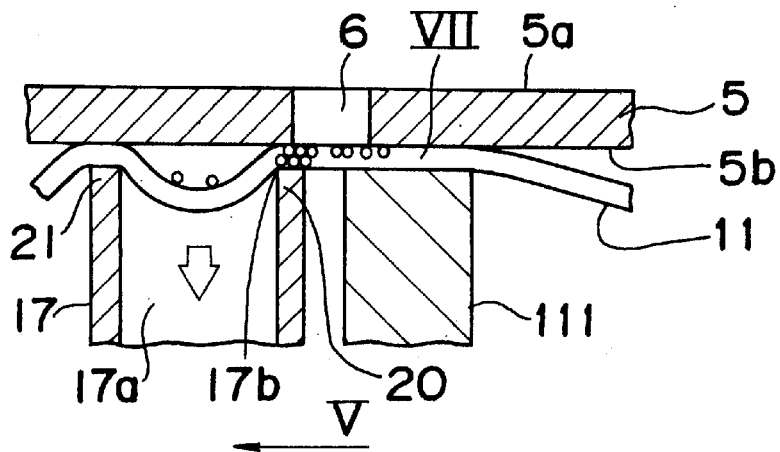

However, since the main wiping portion 111 is provided behind the suction port 17a of the air suction portion 17 as viewed in the direction of movement V, the solder paste 112 remaining unwiped is wiped once again by the portion VII of the cleaning paper 11 which is located between the main wiping portion 111 and the back 5b of the mask 5 as shown in FIG. 2C. The results of tests conducted for development of the cleaning apparatus of the present embodiment verify that a region spaced within a distance of about 2 mm from an edge 17b of the suction port 17a of the air suction portion 17 in a direction counter to the direction of movement V is a region in which the cleaning paper 11 is readily saturated with solder paste 4, and that a region spaced more than 2 mm from the edge 17b opposite to the direction of movement is a region which is sufficient for wiping off solder paste 4. Therefore, in the first embodiment, the span of the main wiping portion 111 as viewed in the direction of movement V is designed to be at least 5 mm as stated above. It is noted that where the span of the main wiping portion 111 is 15 mm to 25 mm, there can be about 10% improvement in removal efficiency over the prior art cleaning apparatus which is not provided with the main wiping portion 111 and in which the span of the contact portion 20 of the air suction portion 17 is 2 mm.

When the cleaning apparatus 101 has moved to the cleaning end position II, air suction by the air suction mechanism 16 is stopped, and the air suction portion 17 and the main wiping portion 111 are lowered. At this point in time, a motor 123 is driven to actuate the cleaning paper take-up 13 to take up dirty cleaning paper 11, and fresh cleaning paper 11 is supplied from the cleaning paper feeder 12. Subsequently, the cleaning apparatus 101 is caused to return to the cleaning start position I by the driving unit 122, whereupon the cleaning operation ends with respect to the mask 5.

In this way, with the cleaning apparatus 101 according to the first embodiment, the main wiping portion 111 provided therein permits any adhered solder paste 4 on the mask 5 to be removed at high removal ratio throughout the entire run from the cleaning start position I to the cleaning end position II.

Figure 3:
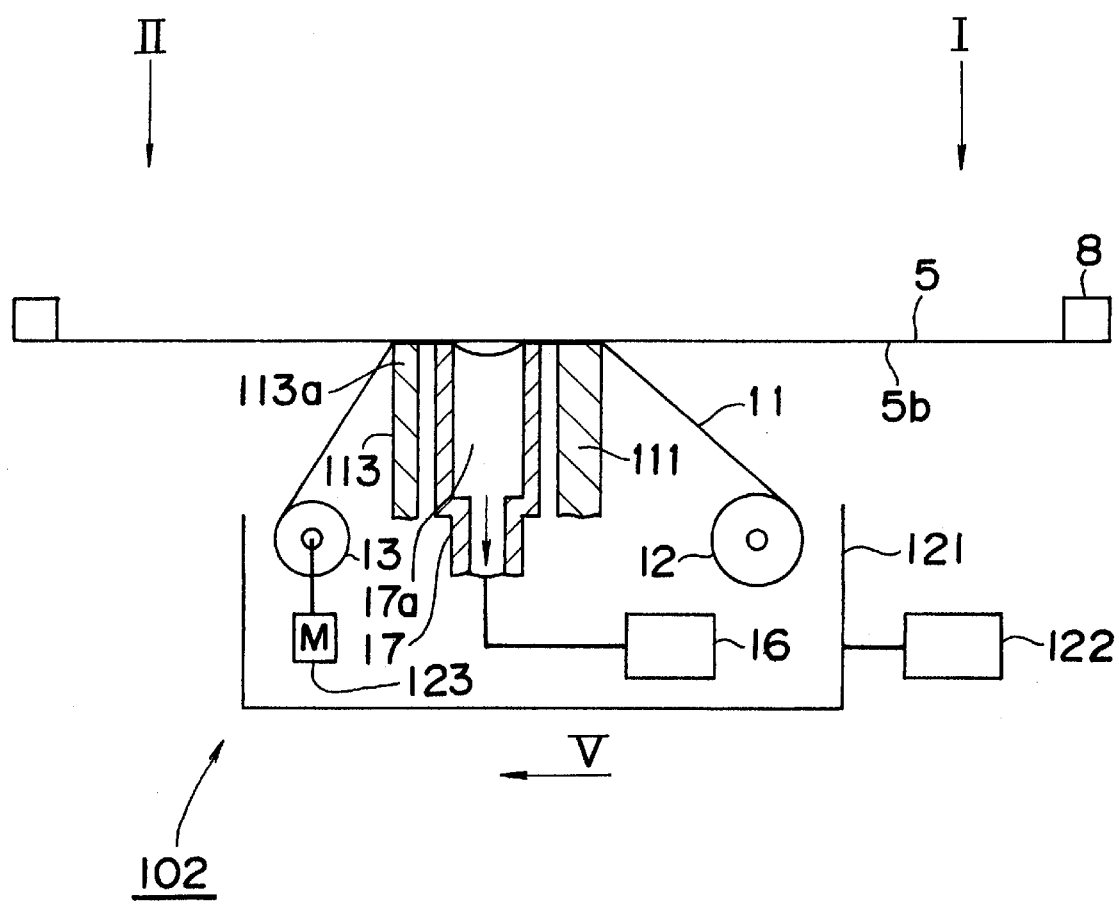
FIG. 3 ia a view showing the arrangement of a modified example of the cleaning apparatus of FIG. 1.

Next, a more preferred form of cleaning apparatus 102 is illustrated in FIG. 3, wherein a subsidiary wiping portion 113 is provided ahead of the suction port 17a of the air suction portion 17 as viewed in the direction of movement V of the cleaning apparatus 101. The subsidiary wiping portion 113, like the main wiping portion 111, is an elongate plate-like member extending along the length of the air suction portion 17 which extends in a direction orthogonal to the direction of movement V, is mounted on the movable carriage 121, and is made from the same material as the main wiping portion 111. Therefore, during the process of cleaning the back 5b of the mask 5, a contact portion 113a of the subsidiary wiping portion 113 is pressed against the back 5b through the cleaning paper 11 and moves along with the air suction portion 17 and the like in the direction of movement V as the movable carriage 121 moves in that direction.

The span of the contact portion 113a of the subsidiary wiping portion 113 as viewed in the direction of movement V may be made shorter than that of the contact portion 111a of the main wiping portion 111 as viewed in the direction of movement V, as shown in FIG. 3. The reason for this is that since the subsidiary wiping portion 113 is disposed ahead of the suction port 17a as viewed in the direction of movement V, it does not collect any solder paste 4 discharged from the openings 6 of the mask 5 and is only intended to effect collection of solder paste 4 adhered on the back 5b of the mask 5 onto the cleaning paper 11.

Where both the subsidiary wiping portion 113 and the main wiping portion 111 are provided in this way, the span of the contact portion 113a of the subsidiary wiping portion 113 may be shorter than that of the contact portion 111a of the main wiping portion 111 as viewed in the direction of movement V. Further, as already stated, it is necessary that the span of the main wiping portion 111 be more than 2 mm. Therefore, a combined span of the main wiping portion 111 and subsidiary wiping portion 113 may be at least 5 mm. For example, the span of the main wiping portion 111 may be 3 mm or more, and the span of the subsidiary wiping portion may be 2 mm or more. Where the cleaning apparatus 102 reciprocates between the cleaning start position I and the cleaning end position II, it is no longer necessary to discriminate the main wiping portion 111 and the subsidiary wiping portion 113 from each other, and therefore the main wiping portion 111 and the subsidiary wiping portion 113 may be of equal span.

By providing such subsidiary wiping portion 113 in addition to the main wiping portion 111 in this way it is possible to collect part of the solder paste 4 adhering to the back 5b of the mask 5, thus enhancing removal efficiency.

Second Embodiment

Figure 4:
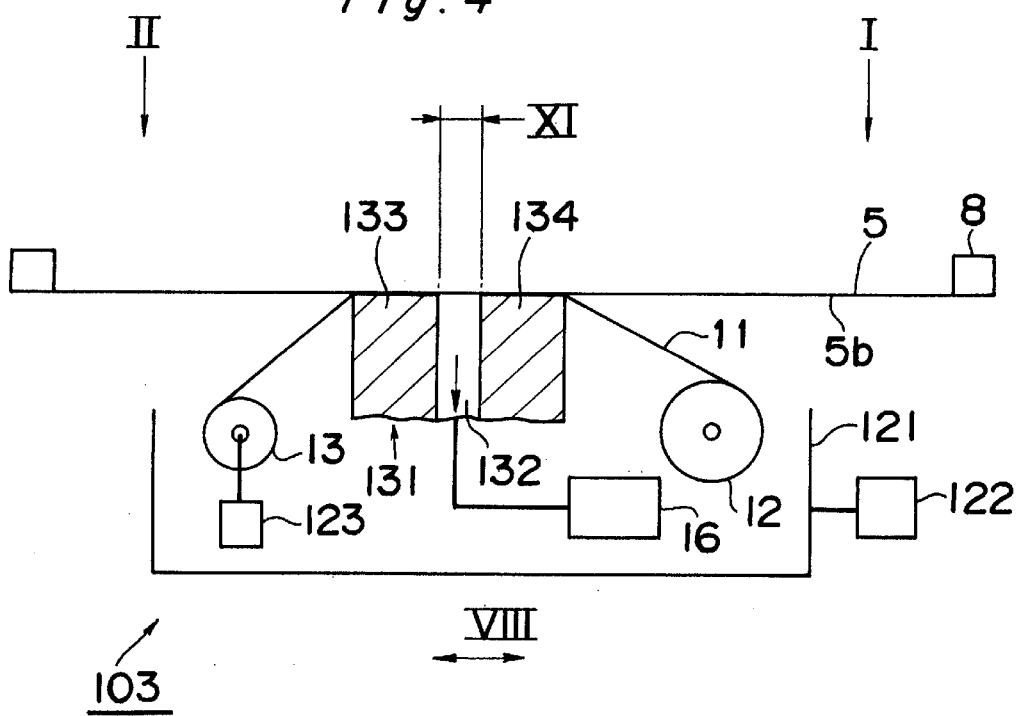
FIG. 4 is a view showing the arrangement of a cleaning apparatus representing a second embodiment of the invention.

In the above described cleaning apparatus 101, 102 of the first embodiment, main wiping portion 111, or main wiping portion 111 and subsidiary wiping portion 113 are provided separately from the air suction portion 17. The cleaning apparatus of the second embodiment includes a cleaning nozzle 131 having a main wiping portion formed integrally with the air suction portion, or having a combination of the main wiping portion and the subsidiary wiping portion formed integrally with the air suction portion. The cleaning apparatus 103 shown in FIG. 4 is of the type in which the apparatus reciprocally moves between the cleaning start position I and the cleaning end position II. Therefore, the cleaning nozzle 131 is of the type in which both the main wiping portion and the subsidiary wiping portion are integrally formed with the air suction portion, and accordingly the main wiping portion and the subsidiary wiping portion are of equal span as viewed in the directions of movement of the cleaning apparatus.

Figure 6:
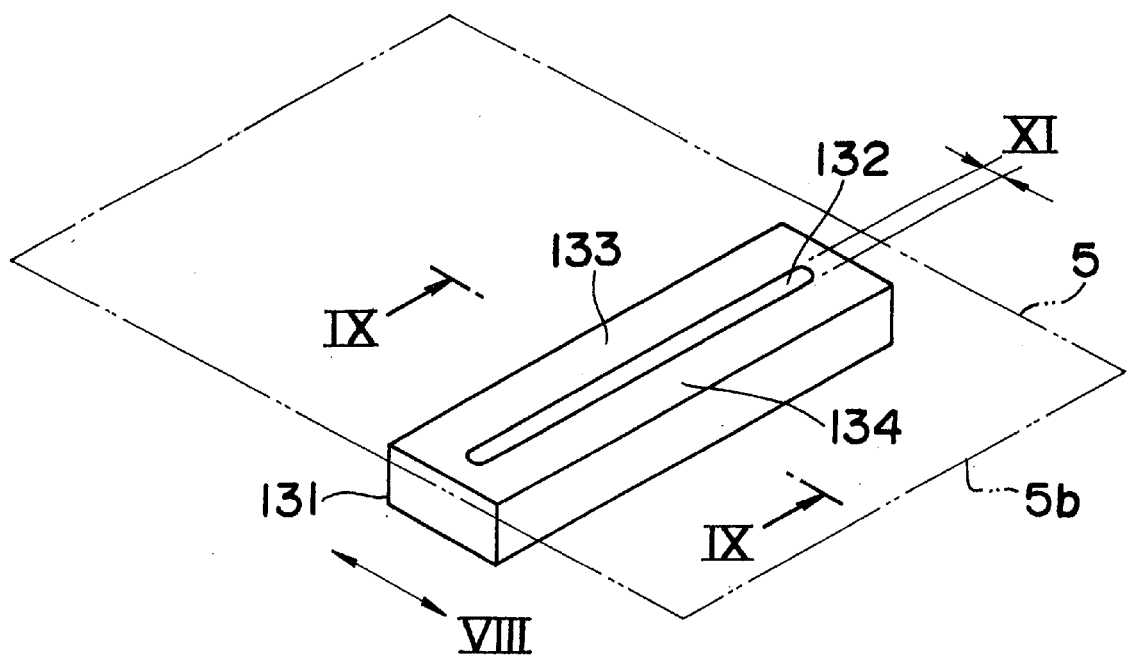
FIG. 6 is a perspective view of a cleaning nozzle of the cleaning apparatus shown in FIG. 4.

Such a cleaning nozzle 131, as shown in FIG. 6, is an elongate plate-like member extending with the approximately same length as the width of the mask 5 and in the direction of the width of the mask 5 which is perpendicular to the direction of reciprocal movement VIII, and is centrally formed with a suction port 132 of an elongated slot-like configuration in plan which extends along the length of the cleaning nozzle 131. The suction port 132 is connected to the air suction mechanism 16. In the cleaning nozzle 131 of such construction, contact portions 133 and 134, which are located ahead of and behind the suction port 132 in the directions of reciprocal movement VIII of the cleaning apparatus 103, correspond respectively to the main wiping portion 111 and the subsidiary wiping portion of the first embodiment. A combined span of the contact portions 133 and 134 as viewed in the directions of reciprocation VIII may be set to be at least 5 mm as earlier mentioned.

The aperture width XI of the suction port 132 as viewed in the directions of reciprocal movement VIII of the suction port 132 is determined in the following manner. The area of the suction port is set so that the product of a flow rate of suction air flow passing through the suction port multiplied by a velocity of the suction air flow passing through the suction port may be maximized. More particularly, as a relation expressing the force F of air flow there is known the following equation: $F = P \times Q \times V/g$. In the equation, P denotes fluid density, Q denotes flow rate of fluid, V denotes velocity of fluid flow, and g denotes acceleration of gravity. The above relation is also applicable in expressing suction force. A suction port having a suction port area such that force F expressed by the above equation is maximized is capable of producing a maximal force for sucking and removing particles of solder paste 4 adhered within the openings 6 of and on the back 5b of the mask 5.

Figure 14:
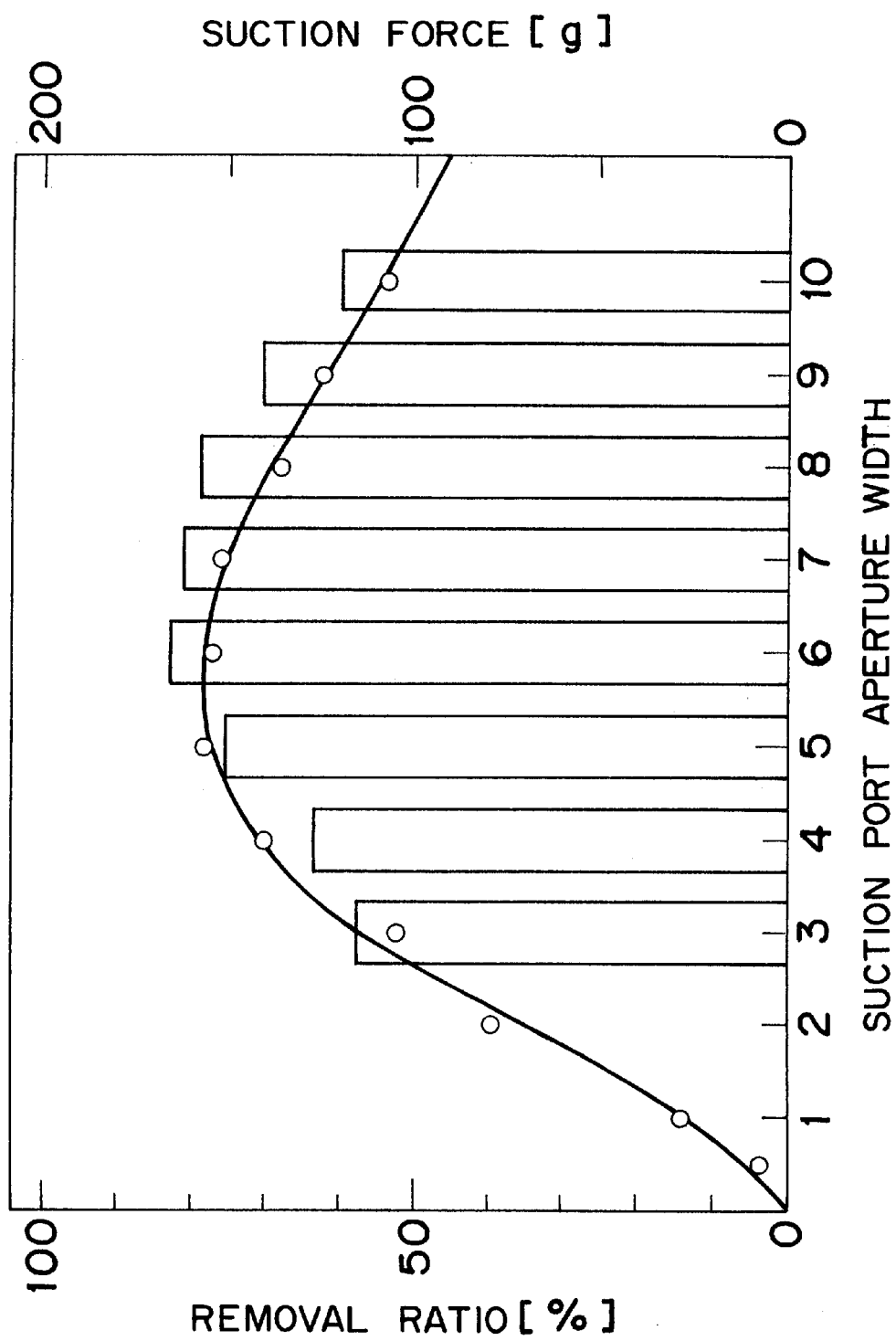
FIG. 14 is a graph showing the relationship between opening width of suction port, suction force and removal efficiency.
Figure 15:
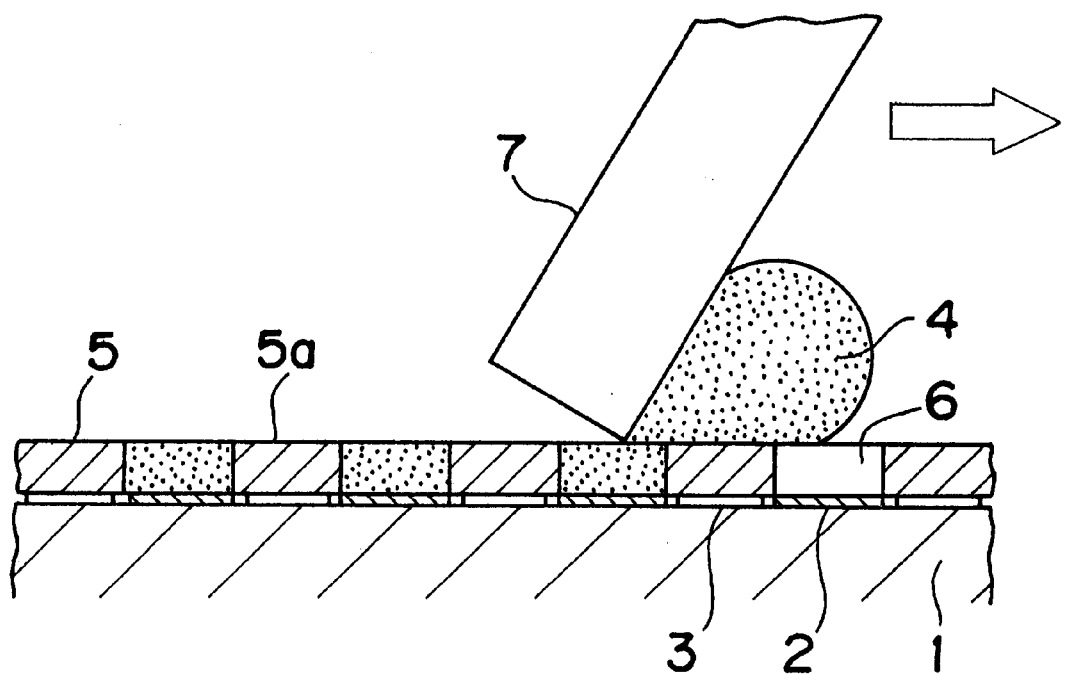
FIG. 15 is a sectional view showing the manner in which solder paste is printed on a board using a mask.
Figure 16:
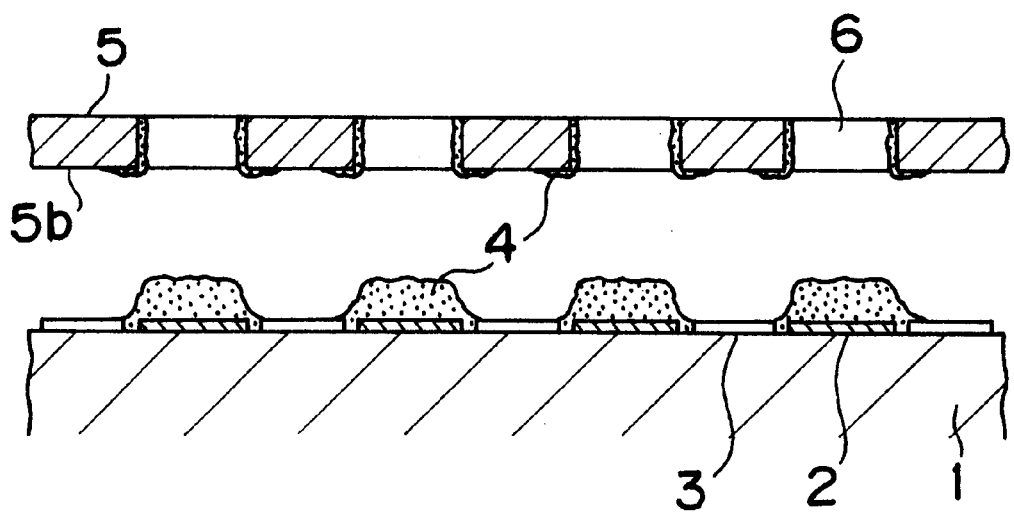
FIG. 16 is a view showing the mask and board as seen when the mask is taken away from the board after printing.
Figure 17:
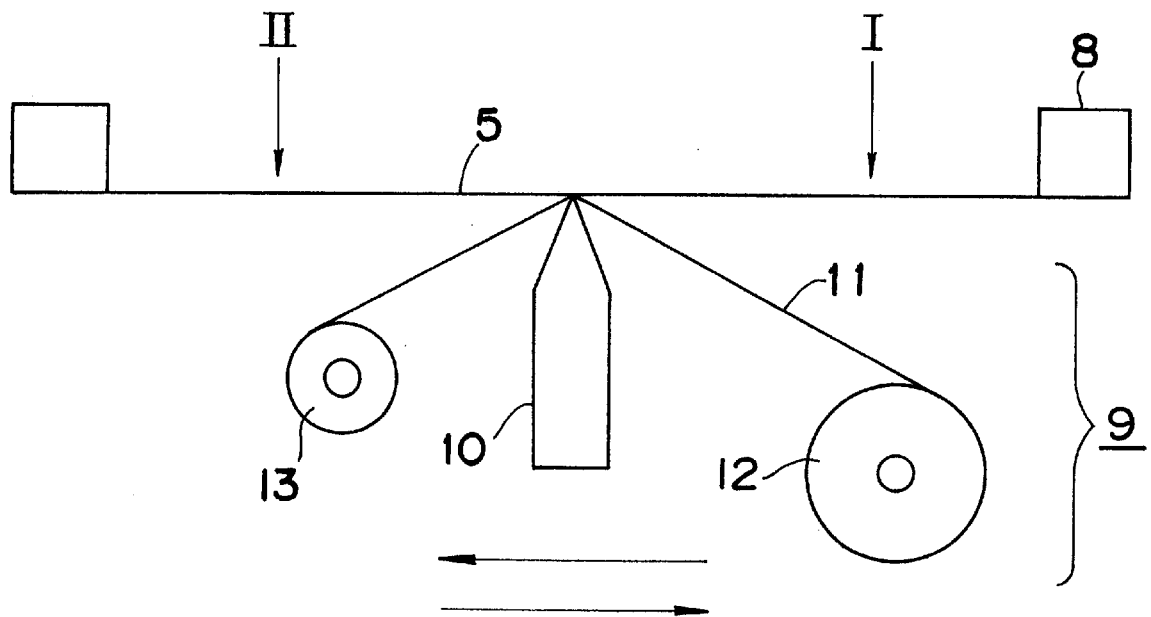
FIG. 17 is a view showing the arrangement of a conventional cleaning apparatus.

On the basis of such a theoretical review, as FIG. 14 shows, measurements are made with respect to the relationship between an aperture width XI of the suction port, a suction force, and a removal efficiency for solder paste 4. As may be apparent from FIG. 14, values for removal efficiency and suction force F are maximized where the aperture width XI of a suction port of the cleaning nozzle is 6 mm. Therefore, in the present embodiment, the aperture width XI of the suction port 132 of the cleaning nozzle 131 is set to 6 mm. However, a similar effect is obtainable even where the aperture width XI is 5 mm to 9 mm.

The manner of operation of the cleaning apparatus 103 equipped with such a cleaning nozzle 131 is the same as that in the case of the earlier described cleaning apparatus 102, for example. Therefore, description thereof is omitted.

Figure 5:
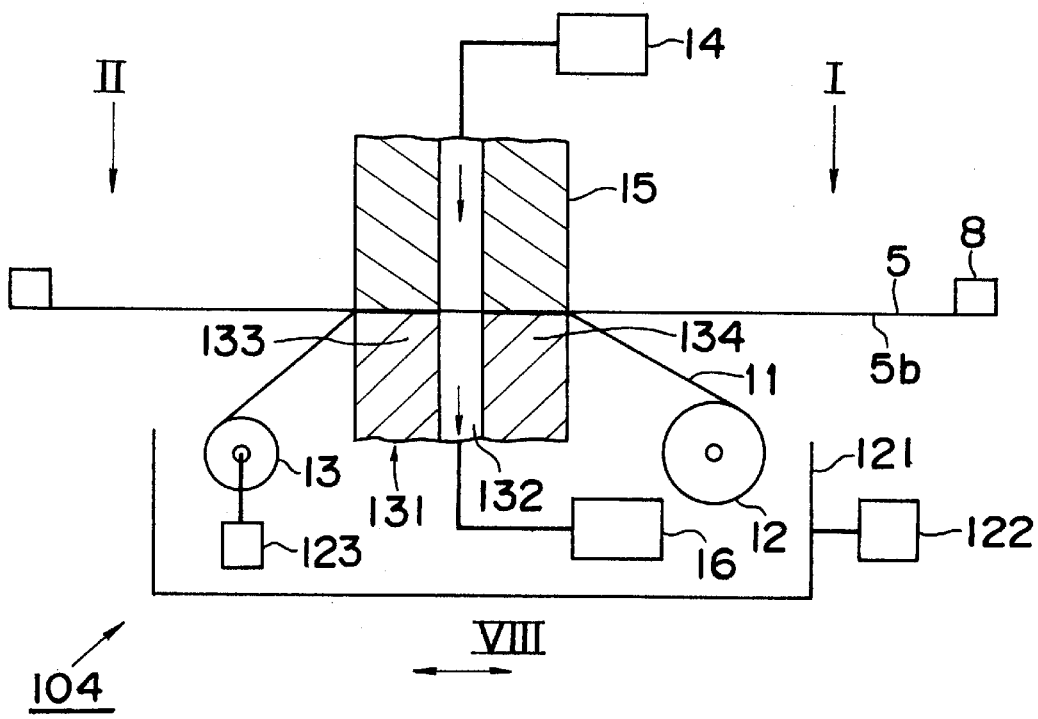
FIG. 5 is a view showing the arrangement of a modified example of the cleaning apparatus shown i.
Figure 18:
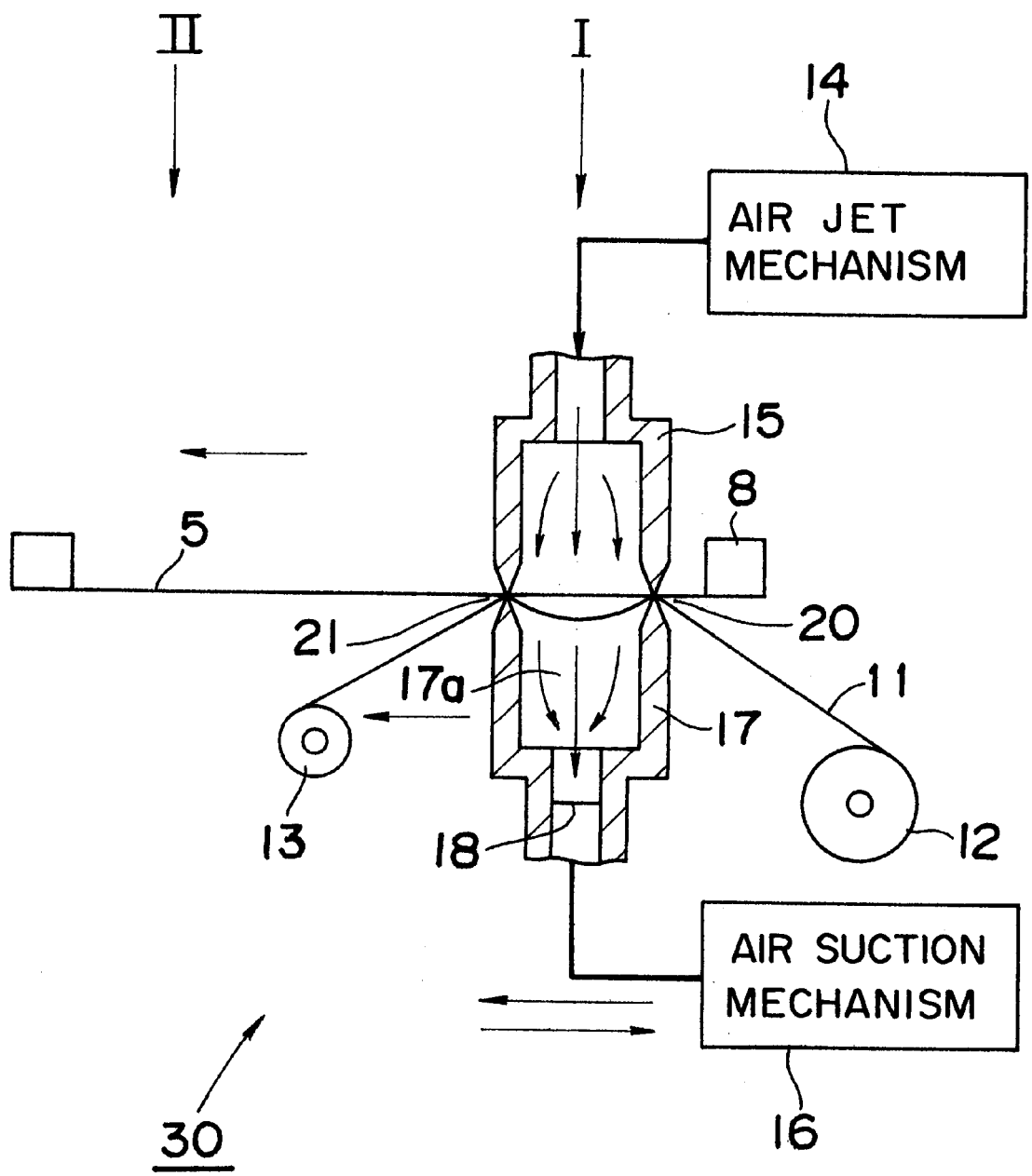
FIG. 18 is a view showing the arrangement of another conventional cleaning apparatus.

Further, the cleaning apparatus 103 may include an air jet portion 15 connected to such an air jet mechanism 14 as shown in FIG. 18. Such a cleaning apparatus is shown as the cleaning apparatus 104 in FIG. 5. In this case, it is desirable that the air jet portion 15 should have a wall thickness corresponding to that of the contact portions 133, 134 of the cleaning nozzle 131 so that the air jet portion 15 can exert bias against the contact portions 133, 134 of the cleaning nozzle 131 so as to facilitate more effective removal of solder paste 4 at the contact portions 133, 134. Various cleaning nozzles to be described hereinbelow may also include an air jet portion 15 having an air jet mechanism 14.

Modified examples of the cleaning nozzle will be described hereinbelow.

Figure 7:
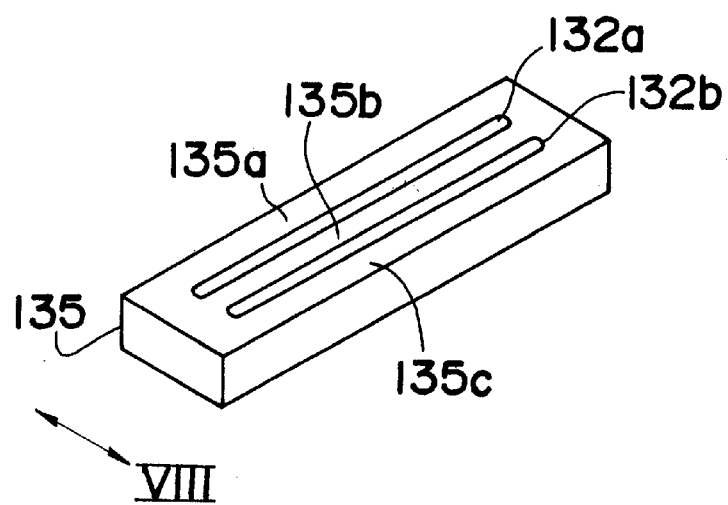
FIG. 7 is a perspective view showing a modified example of the cleaning nozzle shown in FIG. 6.

As FIG. 7 shows, it is possible to construct a cleaning nozzle 135 having two suction ports 132a, 132b extending in parallel along the length of the cleaning nozzle. The aperture width XI of the suction ports 132a, 132b is 6 mm, for example, In such a cleaning nozzle 135, individually located before and behind suction port 132a, 132b as viewed in the aforesaid directions VIII of reciprocal movement are the contact portions 135a, 135b, 135c, of which contact portion 135b corresponds to the main wiping portion 111 at all times, and the contact portion 135a, 135c corresponds to main wiping portion ill or the subsidiary wiping portion 113 as the case may be. Where two suction ports are provided along the reciprocal movement path VIII in this way, one contact portion corresponding to the main wiping portion 111 is located immediately behind the suction port 132a, 132b. Therefore, the span of each contact portion 135a, 135b, 135c of the cleaning nozzle 135 as viewed in the directions of reciprocal movement VIII can be made shorter than that in the case of the cleaning nozzle 131. Therefore, in the cleaning nozzle 135, the total of individual spans of contact portions 135a, 135b, 135c as viewed in the directions of reciprocal movement VIII may be not less than 5 mm but not more than about 40 mm.

Provision of two suction ports 132a, 132b in this way means that two contact portions corresponding to the main wiping portion 111 are provided in the direction of forward movement. Therefore, the cleaning nozzle 135 is capable of further enhancing the removal of solder paste 4 as compared with the cleaning nozzle 131.

Figure 8:
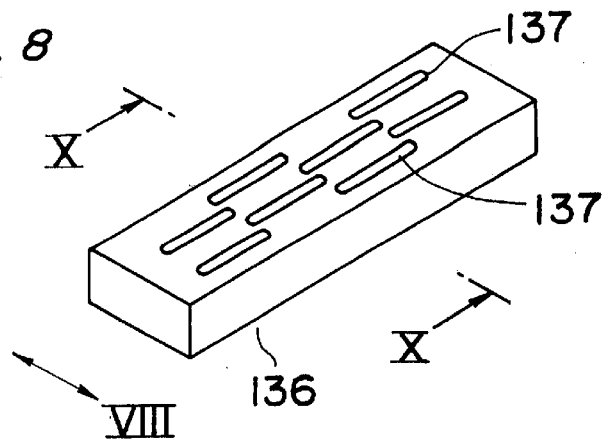
FIG. 8 is a perspective view showing another modified example of the cleaning nozzle shown in FIG. 6.

In the cleaning nozzle 135, each of the suction ports 132a, 132b extends longitudinally of the cleaning nozzle 135 and in a linearly continuous fashion. Also, it is possible to construct a cleaning nozzle 136 having suction ports 137 arranged in longitudinally spaced relation, with the suction ports 137 staggered from one another, as shown in FIG. 8. The cleaning nozzle 136 has suction ports 137 arranged along the path of two reciprocation VIII. The aperture width XI of each suction port 137 is 6 mm as earlier mentioned.

The reason why the suction ports 137 are arranged in staggered relation is explained below. That is, where the cleaning nozzle is made from a soft material, for example, "Duracan", (which is generally known as acetal polymer) with the cleaning nozzle 135 shown in FIG. 7, the width of the contact portion 135b between the suction port 132a and the suction port 132b is so narrow that the cleaning nozzle may lack strength, it being thus possible that the back 5b of the mask 5 and the contact portion 135b may not come into contact with each other through the cleaning paper 11. Therefore, by arranging the suction ports in staggered relation is it possible to prevent the cleaning nozzle from suffering any lack of strength to thereby insure positive contact between the cleaning nozzle and the back 5b through the cleaning paper 11.

Figure 9:
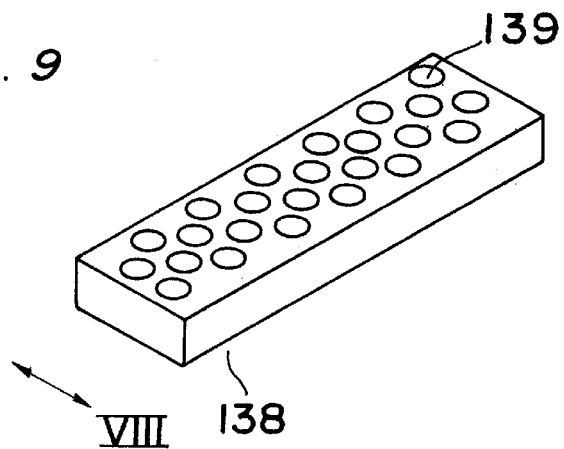
FIG. 9 is a perspective view showing still another modified example of the cleaning nozzle in FIG. 6.

In the above described cleaning nozzles 131, 135, 136, suction ports 132, 137 have elongated slot configurations in plan view, but may have circular shapes in plan view as shown in FIG. 9 to define suction ports 139. A cleaning nozzle 138 has such suction ports 139 arranged in staggered relation. In the cleaning nozzle 138, pairs of suction ports 139 are so arranged along the path of reciprocal movement VIII. Each suction port 139 has a diameter of 3 to 5 mm.

Figure 10:
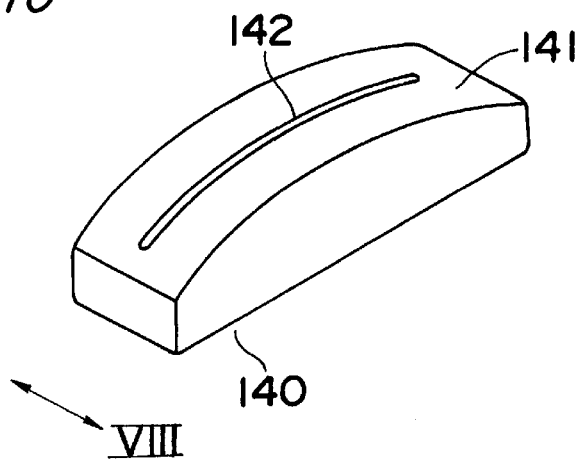
FIG. 10 is a perspective view showing a further modified example of the cleaning nozzle shown in FIG. 6.

Further, as FIG. 10 illustrates, a cleaning nozzle 140 may have a configuration such that a contact surface 141 which contacts the back 5b of the mask 5 through cleaning paper 11 is convexly curved along the length of the cleaning nozzle 140. Where the cleaning nozzle 140 with such a curved contact surface 141 is used, during a cleaning operation the mask 5 is forcibly curved in a concave fashion along the contact surface 141 when the cleaning nozzle 140 comes in contact with the back 5b of the mask 5 through the cleaning paper 11. Thus, it is possible to enhance the contact between the back 5b of the mask 5 and the contact surface 141 of the cleaning nozzle 140 through the cleaning paper 11, thereby further enhancing the removal ratio with respect to solder paste 4.

The cleaning nozzle 140 is of the type having a single suction slot as in the cleaning nozzle 131, but may be of the type having such suction ports as formed in cleaning nozzles 135, 136, or 138.

Figure 11:
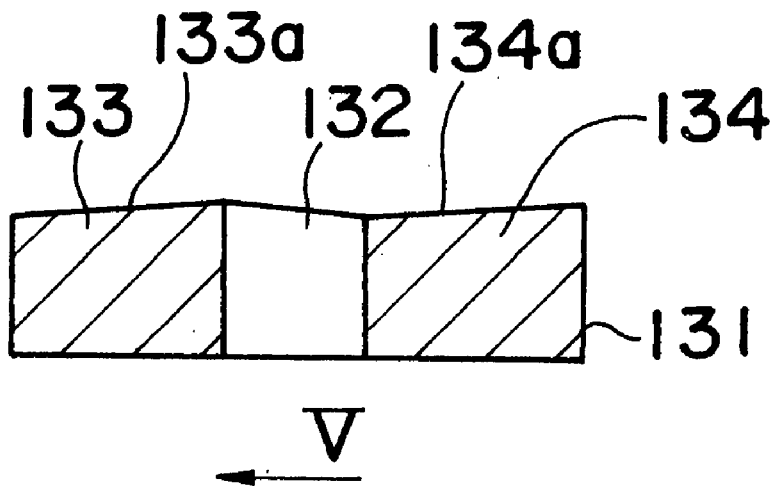
FIG. 11 is a section taken along line IX—IX in FIG. 6.
Figure 12:
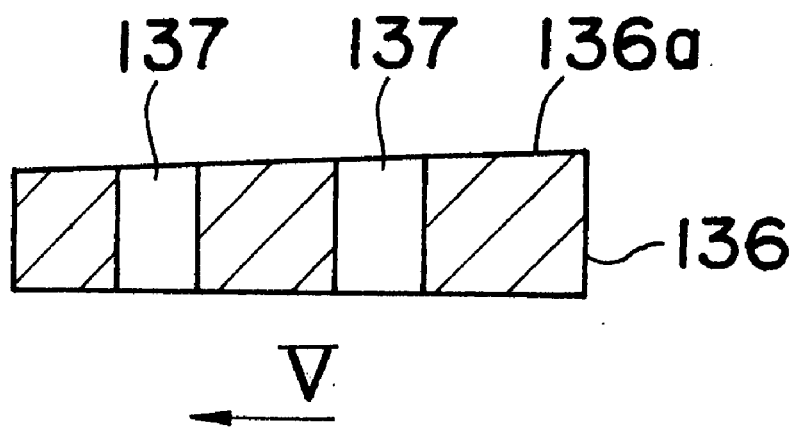
FIG. 12 is a section taken on line X—X in FIG. 8.

In the foregoing description, it is assumed that the cleaning nozzles 131, 135, 136, 138, 140 each are to be used in a cleaning apparatus of the reciprocating type. However, such cleaning nozzle may be employed in a cleaning apparatus of the type which is adapted for one way travel from the cleaning start position I to the cleaning end position II. Where the cleaning apparatus is designed for one way movement, the cleaning nozzle 131, for example, may be such that contact surfaces 133a, 134a of the contact portions 133, 134 located before and behind the suction port 132 for contact with the cleaning paper 11 are each sloped slightly upward in a direction opposite to the direction of movement as shown in FIG. 11. Also, as FIG. 12 shows, the cleaning nozzle 136, for example, may be configured so that contact surface 136a of the cleaning nozzle 136 is, in its entirety, sloped slightly upward in the direction opposite to the direction of movement.

By so configuring the cleaning nozzle that its surface of contact with the cleaning paper 11 is sloped upward in the direction opposite to the direction of movement it is possible to expect that during a cleaning operation the pressing force of the cleaning nozzle is gradually increased in the direction opposite to the direction of movement when the cleaning nozzle is pressed against the back 5b of the mask 5 through the cleaning paper 11. This enables the cleaning nozzle to wipe off the solder paste 4 more effectively.

In the above described cleaning apparatus 101, 102, 103, 104, after the wiping off of solder paste 4 by the cleaning paper 11 is completed and after the air suction portion 17 and wiping portions 111, 113, or cleaning nozzle 131 are lowered, the cleaning paper take-up 13 is driven by the motor 123 to take up the dirty cleaning paper 11 and supply fresh cleaning paper. However, the cleaning operation is not limited to such a mode of operation. During the process of cleaning in which the cleaning paper 11 is in contact with the back 5b of the mask 5, the cleaning apparatus may be moved while the cleaning paper take-up 13 is actuated by the motor 123 to take up the cleaning paper 11. Through such operation it is possible to supply fresh cleaning paper 11 free of dirt to that portion of the cleaning paper which is held between the wiping portions 111; 113 or contact portions 133, 134 of the cleaning nozzle 131 or the like and the back 5b of the mask 5, to thereby remove solder paste 4 from the mask 5 at higher removal efficiency.

Timing for taking up the cleaning paper 11 by the cleaning paper take-up 13 may be set so that the cleaning paper 11 can be taken up at any time when the cleaning nozzle 131, for example, is moving while maintaining its contact with the back 5b of the mask 5 via the cleaning paper 11, or such taking-up may be effected each time the cleaning apparatus travels a given distance.

As earlier stated, according to the first embodiment of the invention for cleaning apparatus, and the second embodiment for cleaning method, when viewed in the direction of movement of the suction portion which has a suction port, a main wiping portion is provided behind the opening of the suction port for removal of printing material adhered in the openings of and on the back of the printing mask, whereby printing material adhered on the mask can be cleaned off at higher removal efficiency. Therefore, during the process of printing after cleaning, occurrence of printing defects, such as poor off-plate effects and solder ball bridges, can be prevented.

The entire disclosure of Japanese Patent Application No. 8-261660 filed on Oct. 2, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A printing mask cleaning apparatus for cleaning a printing mask formed with openings of a predetermined pattern after a printing operation has been carried out to cause printing material to be printed through the openings of the printing mask onto a surface to be printed, the printing mask cleaning apparatus comprising:
- a suction portion movable during a cleaning operation while in contact through a cleaning sheet with a back of the printing mask which contacts the surface to be printed, the suction portion having at least one suction port which opens in a direction so as to be in opposed relation to the back of the printing mask, the suction portion extending in a direction orthogonal to a direction of movement thereof;
- a vacuum device for sucking gas through the openings and the suction port of the suction portion while the suction portion is held in contact with the back of the printing mask through the cleaning sheet, so that a printing material adhered within the openings of the printing mask can be discharged toward the back; and
- a main wiping portion disposed behind an aperture of the suction port as viewed in the direction of movement of the suction portion, and movable in the direction of movement of the suction portion while in pressure contact with the back of the printing mask during the cleaning operation for wiping onto the cleaning sheet printing material adhered on the back of the printing mask and a printing material mass discharged from the openings through suction by the vacuum device.

2. A printing mask cleaning apparatus as set forth in claim 1, wherein a span of the main wiping portion as measured in the direction of movement of the apparatus is not less than 5 mm.

3. A printing mask cleaning apparatus as set forth in claim 1, wherein the main wiping portion is formed integrally with the suction portion.

4. A printing mask cleaning apparatus as set forth in claim 1, further comprising a subsidiary wiping portion disposed ahead of the aperture of the suction port as viewed in the direction of movement of the suction portion, and movable in the direction of movement of the suction portion while in pressure contact with the back of the printing mask during the cleaning operation for wiping onto the cleaning sheet a printing material adhered on the back of the printing mask.

5. A printing mask cleaning apparatus as set forth in claim 4, wherein a span of the main wiping portion as viewed in the direction of movement of the suction portion is larger than that of the subsidiary wiping portion.

6. A printing mask cleaning apparatus as set forth in claim 4, wherein a combined span of the main wiping portion and the subsidiary wiping portion as viewed in the direction of movement of the suction portion is not less than 5 mm.

7. A printing mask cleaning apparatus as set forth in claim 4, wherein the main wiping portion and the subsidiary wiping portion are formed integrally with the suction portion.

8. A printing mask cleaning apparatus as set forth in claim 4, wherein the main wiping portion and the subsidiary wiping portion are formed so as to have approximately the same length in the direction of movement of the suction portion, and wherein the subsidiary wiping portion performs approximately the same function as the main wiping portion which wipes onto the cleaning sheet printing material adhered on the back of the printing mask and a printing material mass discharged from the openings through suction by the vacuum device.

9. A printing mask cleaning apparatus as set forth in claim 1, wherein an aperture area of the suction port of the suction portion is an area such that a product of a flow rate of gas passing through the suction port under suction as multiplied by a flow velocity of the gas is maximized.

10. A printing mask cleaning apparatus as set forth in claim 1, wherein said at least one suction port comprises a plurality of suction ports arranged in the direction of movement of the suction portion; and further comprising at least one additional wiping portion; wherein said main wiping portion and said at least one additional wiping portion are respectively provided behind and before apertures of said suction ports as viewed in the direction of movement of the suction portion.

11. A printing mask cleaning apparatus as set forth in claim 1, wherein said at least one suction port comprises a plurality of suction ports arranged in staggered relation along a length of the suction portion; and further comprising at least one additional wiping portion; wherein said main wiping portion and said at least one additional wiping portion are respectively provided behind and before apertures of said suction ports as viewed in the direction of movement of the suction portion.

12. A printing mask cleaning apparatus as set forth in claim 1, wherein a surface of the suction portion which contacts the back of the printing mask through the cleaning sheet is curved in a convex fashion along a length of the suction portion.

13. A printing mask cleaning apparatus as set forth in claim 1, wherein the cleaning sheet is movable relative to the movement of the suction portion.

14. A printing mask cleaning method for cleaning a printing mask formed with openings of a predetermined pattern after a printing operation has been carried out to cause printing material to be printed through the openings of the printing mask onto a surface to be printed, wherein a cleaning operation is carried out using a printing mask cleaning apparatus which comprises:
- a suction portion movable during a cleaning operation while in contact through a cleaning sheet with a back of the printing mask which contacts the surface to be printed, the suction portion having at least one suction port which opens in a direction so as to be in opposed relation to the back of the printing mask, the suction portion extending in a direction orthogonal to a direction of movement thereof; and
- a vacuum device for sucking gas through the openings and the suction port of the suction portion while the suction portion is held in contact with the back of the printing mask through the cleaning sheet, so that a printing material adhered within the openings of the printing mask can be discharged toward the back;

the method comprising:
- after causing the printing material adhered within the openings of the printing mask to be discharged toward the back by suction of the vacuum device,
- wiping onto the cleaning sheet printing material adhered on the back of the printing mask and the adhered printing material discharged by suction from the openings by means of a main wiping portion disposed behind an aperture of the suction port as viewed in the direction of movement of the suction portion, and movable in the direction of movement of the suction portion while in pressure contact with the back of the printing mask during the cleaning operation, so as to clean the printing mask.

15. A printing mask cleaning method as set forth in claim 14, wherein before the printing material adhered within the openings of the printing mask is discharged toward the back of the printing mask, the printing material adhered on the back is wiped onto the cleaning sheet by means of a subsidiary wiping portion disposed ahead of the aperture of the suction port as viewed in the direction of movement of the suction portion, and movable in the direction of movement of the suction portion while in pressure contact with the back of the printing mask during the cleaning operation.

16. A printing mask cleaning method as set forth in claim 15, wherein a span of the main wiping portion as viewed in the direction of movement of the suction portion is larger than a span of the subsidiary wiping portion as viewed in the direction of movement of the suction portion.

17. A printing mask cleaning method as set forth in claim 14, wherein the at least one port comprises a plurality of suction ports arranged in the direction of movement of the suction portion, and the main wiping portion and at least one additional wiping portion are respectively provided behind and before apertures of the suction ports as viewed in the direction of movement of the suction portion.

18. A printing mask cleaning method as set forth in claim 14, wherein the at least one suction port comprises a plurality of suction ports arranged in staggered relation along a length of the suction portion, and wherein the main wiping portion and at least one additional wiping portion are respectively provided behind and before apertures of the suction ports as viewed in the direction of movement of the suction portion.

* * * * *